(12) United States Patent
Kondo et al.

(10) Patent No.: US 10,693,441 B2
(45) Date of Patent: Jun. 23, 2020

(54) ACOUSTIC WAVE FILTER

(71) Applicant: TAIYO YUDEN CO., LTD., Tokyo (JP)

(72) Inventors: Hiroki Kondo, Tokyo (JP); Soichiro Ikeda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 97 days.

(21) Appl. No.: 15/916,095

(22) Filed: Mar. 8, 2018

(65) Prior Publication Data

US 2018/0278237 A1    Sep. 27, 2018

(30) Foreign Application Priority Data

Mar. 21, 2017    (JP) .................................. 2017-054822

(51) Int. Cl.
    *H03H 9/64*     (2006.01)
    *H03H 9/145*     (2006.01)
    *H03H 9/02*     (2006.01)

(52) U.S. Cl.
CPC ...... *H03H 9/6406* (2013.01); *H03H 9/02637* (2013.01); *H03H 9/14544* (2013.01); *H03H 9/6466* (2013.01); *H03H 9/02559* (2013.01); *H03H 9/02834* (2013.01)

(58) Field of Classification Search
CPC .. H03H 9/02637; H03H 9/644; H03H 9/6463; H03H 9/6466; H03H 9/64
USPC ...................... 333/133, 193, 195; 310/313 D
See application file for complete search history.

(56) References Cited

U.S. PATENT DOCUMENTS

| | | | | |
|---|---|---|---|---|
| 6,650,207 | B1 * | 11/2003 | Tanaka | H03H 9/02685 310/313 D |
| 6,894,588 | B2 * | 5/2005 | Detlefsen | H03H 9/6436 310/313 D |
| 7,002,438 | B2 * | 2/2006 | Kawachi | H03H 9/0042 333/195 |
| 7,102,269 | B2 * | 9/2006 | Watanabe | H03H 9/14514 310/313 D |

(Continued)

FOREIGN PATENT DOCUMENTS

| | | |
|---|---|---|
| JP | 9-130203 A | 5/1997 |
| JP | 9-214284 A | 8/1997 |

(Continued)

OTHER PUBLICATIONS

Japanese Office Action dated Feb. 5, 2019 in a counterpart Japanese patent application No. 2017-054822. (A machine translation (not reviewed for accuracy) attached.).

*Primary Examiner* — Dean O Takaoka
(74) *Attorney, Agent, or Firm* — Chen Yoshimura LLP

(57) ABSTRACT

An acoustic wave filter includes: a piezoelectric substrate; a first multimode filter that includes at least three first IDTs located on the piezoelectric substrate, has a first passband, and is connected between an input terminal and an output terminal; and a second multimode filter that includes at least three second IDTs located on the piezoelectric substrate, has a second passband, and is connected in series with the first multimode filter between the input terminal and the output terminal, a part of the second passband overlapping with the first passband, a remaining part of the second passband not overlapping with the first passband.

17 Claims, 6 Drawing Sheets

(56) References Cited

U.S. PATENT DOCUMENTS

| | | | | |
|---|---|---|---|---|
| 7,215,224 B2* | 5/2007 | Noto | ................... | H03H 9/02559 |
| | | | | 333/193 |
| 2002/0135441 A1* | 9/2002 | Takahashi | ............ | H03H 9/0061 |
| | | | | 333/195 |
| 2004/0201435 A1* | 10/2004 | Ouchi | ................... | H03H 9/0057 |
| | | | | 333/195 |
| 2009/0058555 A1* | 3/2009 | Takata | ................. | H03H 9/0576 |
| | | | | 333/129 |
| 2014/0049341 A1 | 2/2014 | Komatsu et al. | | |

FOREIGN PATENT DOCUMENTS

| JP | 2001-217680 A | 8/2001 |
|---|---|---|
| JP | 2002-076836 A | 3/2002 |
| JP | 2004-312576 A | 11/2004 |
| JP | 2005-176254 A | 6/2005 |
| JP | 2007-110542 A | 4/2007 |
| JP | 5716096 B2 | 5/2015 |
| JP | 2017-022501 A | 1/2017 |

* cited by examiner

FIG. 2

| BAND | TRANSMIT BAND [MHz] | Pass/f0 | RECEIVE BAND [MHz] | Pass/f0 |
|---|---|---|---|---|
| 13 | 777 TO 787 | 1.28% | 746 TO 756 | 1.33% |
| 14 | 788 TO 798 | 1.26% | 758 TO 768 | 1.31% |
| 17 | 704 TO 716 | 1.69% | 734 TO 746 | 1.62% |
| 29 | – | – | 717 TO 728 | 1.52% |
| 30 | 2305 TO 2315 | 0.43% | 2350 TO 2360 | 0.42% |
| 31 | 452.5 TO 457.5 | 1.10% | 462.5 TO 467.5 | 1.08% |

ACOUSTIC WAVE FILTER

CROSS-REFERENCE TO RELATED APPLICATION

This application is based upon and claims the benefit of priority of the prior Japanese Patent Application No. 2017-054822, filed on Mar. 21, 2017, the entire contents of which are incorporated herein by reference.

FIELD

A certain aspect of the present invention relates to an acoustic wave filter.

BACKGROUND

There have been known multimode filters in which a plurality of Interdigital Transducers (IDTs) are arranged in the propagation direction of a surface acoustic wave (SAW) on a piezoelectric substrate. Longitudinally-coupled double-mode SAW (DMS: also called as Dual Mode SAW or Double Mode SAW) filters have been often used as the multimode filters. To increase the suppression in other than the passband in the DMS, it has been known to connect a plurality of DMSs in series between an input terminal and an output terminal.

Japanese Patent Application Publication No. 9-130203 describes that the pitches of electrode fingers of DMSs that are two-stage longitudinally-coupled are made to be different by 0.2% to 0.5% to reduce the group delay deviation. Japanese Patent Application Publication No. 9-214284 describes that the passband is widened by combining the passbands of the DMSs.

SUMMARY OF THE INVENTION

According to the first aspect of the present invention, there is provided an acoustic wave filter including: a piezoelectric substrate; a first multimode filter that includes at least three first IDTs located on the piezoelectric substrate, has a first passband, and is connected between an input terminal and an output terminal; and a second multimode filter that includes at least three second IDTs located on the piezoelectric substrate, has a second passband, and is connected in series with the first multimode filter between the input terminal and the output terminal, a part of the second passband overlapping with the first passband, a remaining part of the second passband not overlapping with the first passband.

According to the second aspect of the present invention, there is provided an acoustic wave filter including: a piezoelectric substrate; a first multimode filter that includes at least three first IDTs located on the piezoelectric substrate and is connected between an input terminal and an output terminal, a pitch of a center first IDT of the at least three first IDTs being PT1; and a second multimode filter that includes at least three second IDTs located on the piezoelectric substrate and is connected in series with the first multimode filter between the input terminal and the output terminal, a pitch of a center second IDT of the at least three second IDTs being PT2, $0.005 \leq 2 \times |PT1-PT2|/(PT1+PT2) \leq 0.02$.

BRIEF DESCRIPTION OF THE DRAWINGS

FIG. 2 presents the receive band and the transmit band of each of bands to which the first embodiment is applied;

DETAILED DESCRIPTION

In the DMS, the number of pairs of the IDTs needs to be increased to narrow the passband and increase the attenuation of other adjacent bands. However, the increase in the number of pairs of the IDTs increases the chip size. As described above, it is difficult to achieve a narrower passband and a smaller size.

Hereinafter, a description will be given of embodiments of the present invention with reference to the accompanying drawings.

First Embodiment

Figure 1A:
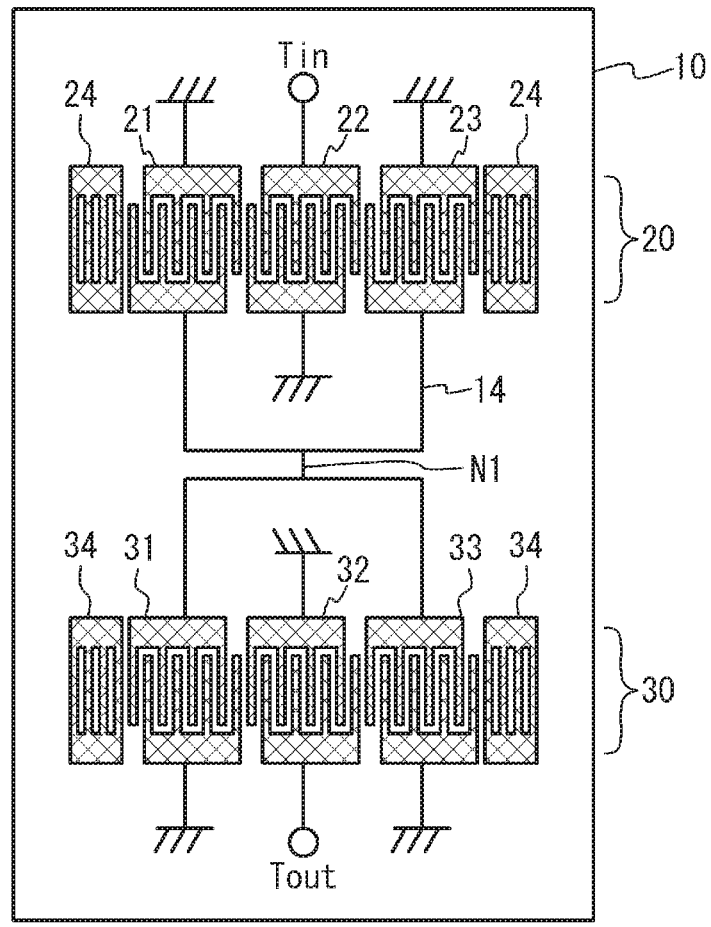
FIG. 1A is a plan view of an acoustic wave filter in accordance with a first embodiment.
Figure 1B:
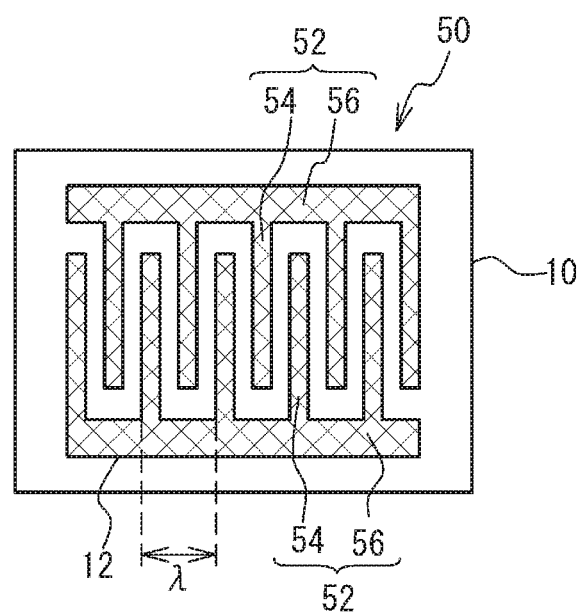
FIG. 1B is a plan view of an IDT.

FIG. 1A is a plan view of an acoustic wave filter in accordance with a first embodiment, and FIG. 1B is a plan view of an IDT. As illustrated in FIG. 1A, located on a piezoelectric substrate 10 are a DMS 20 and a DMS 30. The DMS 20 includes three IDTs, which include a center IDT 22 and IDTs 21 and 23 located at both sides of the IDT 22, and reflectors 24 located lateral to the IDTs 21 and 23. The DMS 30 includes three IDTs, which include a center IDT 32 and IDTs 31 and 33 located at both sides of the IDT 32, and reflectors 34 located lateral to the IDTs 31 and 33.

The structure of the IDT will be described with reference to FIG. 1B. An IDT 50 is located on the piezoelectric substrate 10. The IDT 50 corresponds to each of the IDTs 21 through 23 and 31 through 33 in FIG. 1A. The IDT 50 is formed of a metal film 12 formed on the piezoelectric substrate 10. The IDT 50 includes a pair of comb-shaped electrodes 52. The comb-shaped electrode 52 has a plurality of electrode fingers 54 and a bus bar 56 to which the electrode fingers 54 are coupled. The electrode fingers 54 of one of the comb-shaped electrodes 52 and the electrode fingers 54 of the other of the comb-shaped electrodes 52 are substantially alternately arranged. The application of high-frequency signals to the IDT 50 excites the acoustic wave propagating in the arrangement direction of the electrode fingers 54. The pitch of the electrode fingers 54 of one of the comb-shaped electrodes 52 substantially corresponds to the wavelength λ of the acoustic wave. The average pitch is calculated by dividing the width in the arrangement direction of the electrode fingers 54 of the IDT 50 by the number of pairs of the electrode fingers 54. For the number of pairs, one electrode finger 54 of one of the comb-shaped electrodes 52 and one electrode finger 54 of the other of the comb-shaped electrodes 52 form one pair.

The piezoelectric substrate 10 is, for example, a lithium tantalate substrate or a lithium niobate substrate. The metal film 12 is, for example, an aluminum film or a copper film. A protective film or a temperature compensation film covering the metal film 12 may be located on the piezoelectric substrate 10.

As illustrated in FIG. 1A, the IDTs 21 through 23 and the reflectors 24 are arranged in the propagation direction of the surface acoustic wave excited by the IDTs 21 through 23.

The IDTs 31 through 33 and the reflectors 34 are arranged in the propagation direction of the surface acoustic wave excited by the IDTs 31 through 33. In the DMS 20, the acoustic wave excited by three IDTs 21 through 23 is reflected by the reflectors 24. Thus, the energy of the acoustic wave is confined in the IDTs 21 through 23. A bandpass filter is formed by using two vibration modes, which are first-order and third-order vibration modes, generated by acoustic coupling among the IDTs 21 through 23. The same applied to the DMS 30.

The DMSs 20 and 30 are electrically connected by wiring lines 14 located on the piezoelectric substrate 10. A first comb-shaped electrode of the IDT 22 is coupled to an input terminal Tin through the wiring line 14. A second comb-shaped electrode of the IDT 22 is grounded through the wiring line 14. A first comb-shaped electrode of each of the IDTs 21 and 23 is grounded through the wiring line 14. A second comb-shaped electrode of each of the IDTs 21 and 23 is coupled to a node N1 through the wiring line 14.

A first comb-shaped electrode of the IDT 32 is coupled to an output terminal Tout through the wiring line 14. A second comb-shaped electrode of the IDT 32 is grounded through the wiring line 14. A first comb-shaped electrode of each of the IDTs 31 and 33 is grounded through the wiring line 14. A second comb-shaped electrode of each of the IDTs 31 and 33 is coupled to the node N1 through the wiring line 14. The DMS 20 and the DMS 30 are connected in series between the input terminal Tin and the output terminal Tout. The attenuation in other than the passband can be increased by connecting the DMSs 20 and 30 in series.

FIG. 2 presents the receive band and the transmit band of each of bands to which the first embodiment is applied. As illustrated in FIG. 2, Band13, Band14, Band17, Band29, Band30, and Band31 have narrow receive bands and narrow transmit bands. Band29 is for receiving only. When Pass/f0, which is obtained by dividing the bandwidth Pass of the receive band or the transmit band by the center frequency f0 of the corresponding band, is expressed in %, these Pass/f0 are 2% or less. Furthermore, another band is close to another band. For example, Band13 and Band14 have receive bands close to each other and transmit bands close to each other. The receive band of Band29 is close to the transmit band of Band17. In each of Band17, Band30, and Band31, the receive band is close to the transmit band. As described above, the filter for the band having a narrow bandwidth and being close to another band is required to have a narrow passband and attenuation rapidly increasing in other than the passband.

To narrow the passband in the DMS, it may be considered to increase the number of pairs of the electrode fingers of the DMS. However, the increase in the number of pairs increases the chip area. Thus, the first embodiment shifts the passbands of the DMS 20 and the DMS 30. Hereinafter, a description will be given based on a simulation.

Figure 3:
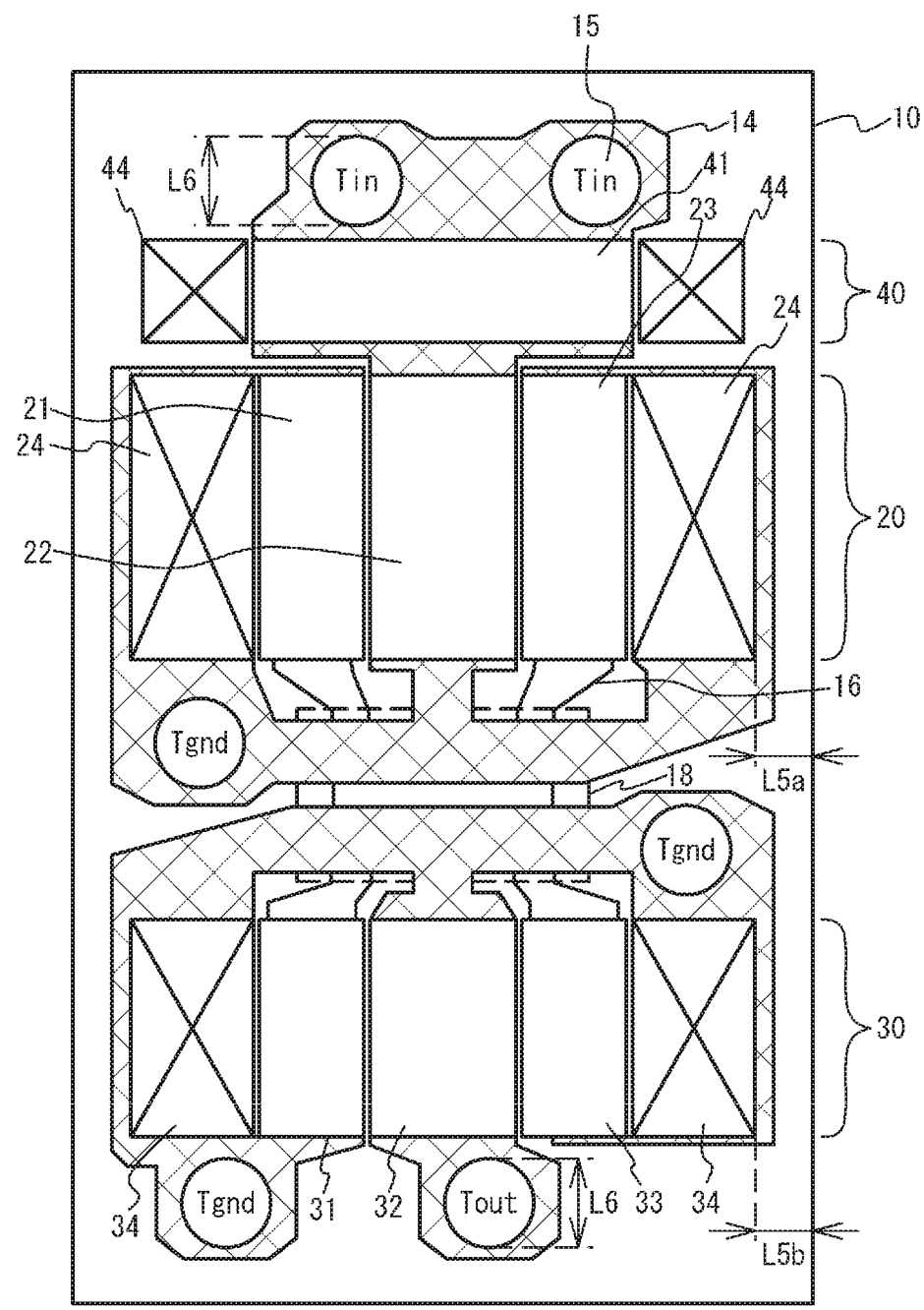
FIG. 3 is a plan view of a simulated acoustic wave filter in accordance with the first embodiment.

FIG. 3 is a plan view of a simulated acoustic wave filter in accordance with the first embodiment. Located on the piezoelectric substrate 10 are the DMSs 20 and 30, a one-port resonator 40, and the wiring lines 14 and 16. The DMS 20 and the DMS 30 are the same as those illustrated in FIG. 1, and the description thereof is thus omitted. The one-port resonator 40 includes an IDT 41 and reflectors 44 located at both sides of the IDT 41. Connection electrodes 15 are coupled to the wiring lines 14. The connection electrodes 15 are connection electrodes for connecting to an external device, and are electrically connected to an input terminal Tin, an output terminal Tout, and ground terminals Tgnd.

The connection electrode 15 is a bump located on the wiring line 14 or a via wiring penetrating through the piezoelectric substrate 10.

Between the input terminal Tin and the output terminal Tout, the resonator 40, the DMS 20, and the DMS 30 are connected in series through the wiring lines 14 and 16. Between the DMSs 20 and 30, the IDTs 21, 22, and 23 and the reflectors 24 of the DMS 20 are commonly coupled to the ground terminal Tgnd through the wiring lines 14. The IDTs 31, 32, and 33 and the reflectors 34 of the DMS 30 are commonly coupled to the ground terminal Tgnd through the wiring lines 14. The IDTs 21 and 23 are coupled to the IDTs 31 and 33 through the wiring lines 16. An insulating film 18 is located between the wiring lines 14 and 16. This structure electrically separates the wiring lines 14 and 16.

Other simulation conditions are as follows.

Piezoelectric substrate 10: 42° rotated Y-cut X-propagation lithium tantalate substrate Metal film 12: Aluminum film with a film thickness of 533.5 nm DMS 20:
  Aperture length: 200 μm
  IDT 21:
  Number of regions in each of which the pitch is uniform: 6 regions
  Number of pairs in respective regions in each of which the pitch is uniform: 8.5 pairs, 1 pair, 2.5 pairs, 2 pairs, 2.5 pairs, 2 pairs
  Total of the number of pairs: 18.5 pairs
  IDT 22:
  Number of regions in each of which the pitch is uniform: 9 regions
  Number of pairs in respective regions in each of which the pitch is uniform: 2.5 pairs, 1 pair, 2 pairs, 3 pairs, 13 pairs, 4 pairs, 3.5 pairs, 3.5 pairs, 5 pairs
  Total of the number of pairs: 37.5 pairs
  IDT 23:
  Number of regions in each of which the pitch is uniform: 6 regions
  Number of pairs in respective regions in each of which the pitch is uniform: 0.5 pairs, 1 pair, 0.5 pairs, 1.5 pairs, 0.5 pair, 6 pairs
  Total of the number of pairs: 10 pairs
  Pitch in the region where the number of pairs is 13 pairs in the IDT 22 (the maximum equal-pitch region): 523 nm
  Average pitch of the IDTs 21 through 23: 509 nm DMS 30:
  Aperture length: 170 μm
  IDT 31:
  Number of regions in each of which the pitch is uniform: 6 regions
  Number of pairs in respective regions in each of which the pitch is uniform: 7 pairs, 3.5 pairs, 1 pair, 4.5 pairs, 1 pair, 2 pairs
  Total of the number of pairs: 19 pairs
  IDT 32:
  Number of regions in each of which the pitch is uniform: 9 regions
  Number of pairs in respective regions in each of which the pitch is uniform: 2.5 pairs, 2 pairs, 3 pairs, 2.5 pairs, 11 pairs, 4 pairs, 2 pairs, 2 pairs, 1.5 pairs
  Total of the number of pairs: 30.5 pairs
  IDT 33:
  Number of regions in each of which the pitch is uniform: 6 regions
  Number of pairs in respective regions in each of which the pitch is uniform: 1 pair, 2 pairs, 1 pair, 1 pair, 1 pair, 5.5 pairs Total of the number of pairs: 11.5 pairs Pitch in the region where the number of pairs is 11 pairs in the IDT 22 (the maximum equal-pitch region): 516 nm Average pitch of the IDTs 31 through 33: 491 nm In the DMSs 20 and 30, the center IDTs 22 and 32 have the greatest number of pairs of the electrode fingers 54. The pitches of the electrode fingers 54 in the IDTs 21 through 23 and 31 through 33 differ. The region where the number of pairs is the largest among regions in each of which the pitch is uniform is defined as the maximum equal-pitch region in each of the IDT 22 and the IDT 32. The number of pairs is the number of pairs in the region where the number of pairs is the largest. The center frequency of the passband of each of the DMSs 20 and 30 is substantially determined by the pitch in the maximum equal-pitch region.

Figure 4:
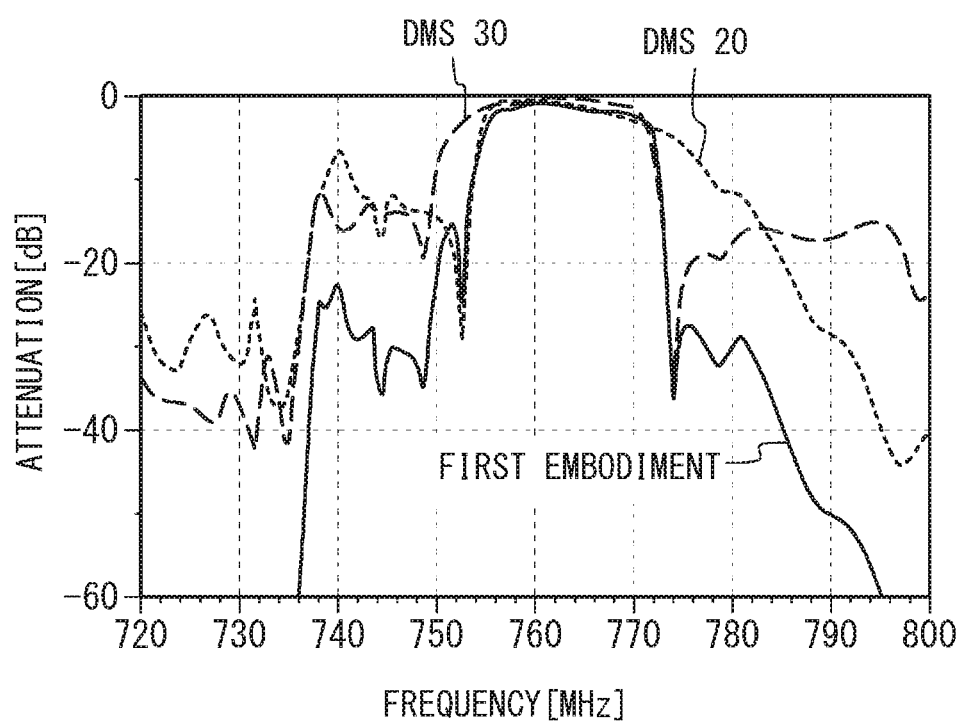
FIG. 4 illustrates transmission characteristics in the first embodiment.

FIG. 4 illustrates transmission characteristics in the first embodiment. The transmission characteristics of the DMSs 20 and 30 alone and the transmission characteristic between the input terminal Tin and the output terminal Tout (indicated as the first embodiment) are presented. As illustrated in FIG. 4, the width of the passband is approximately the same between the DMS 20 and the DMS 30, but the center frequencies of the passbands differ by approximately 4 MHz. The passband of the first embodiment is the band where the passbands of the DMSs 20 and 30 overlap. As described above, the acoustic wave filter having a narrow passband can be achieved without increasing the number of pairs of the DMS 20 and/or the DMS 30.

It is easier to steepen the skirt characteristic at one side of the passband than to steepen the skirt characteristics at both sides of the passband of a DMS. Thus, the DMS 20 is designed so as to have a steep skirt characteristic at the low frequency side, and the DMS 30 is designed so as to have a steep skirt characteristic at the high frequency side. This configuration enables to steepen the skirt characteristics at both sides of the passband.

Figure 5A:
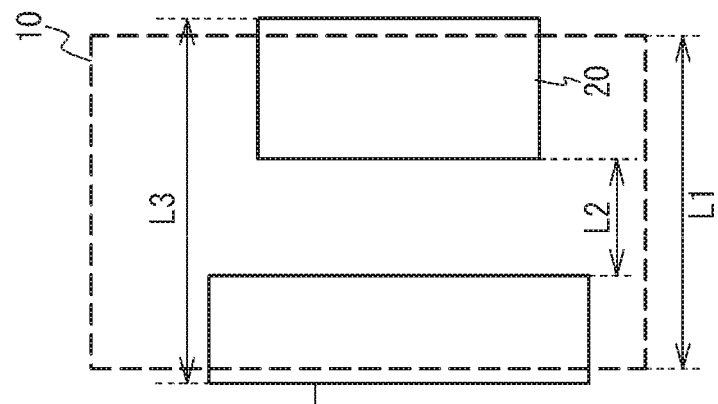
FIG. 5A through FIG. 5C are schematic views for describing the advantage of the first embodiment.
Figure 5B:
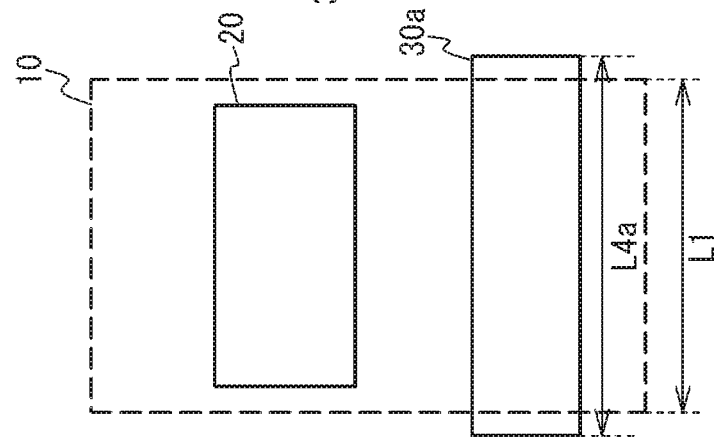
Figure 5C:
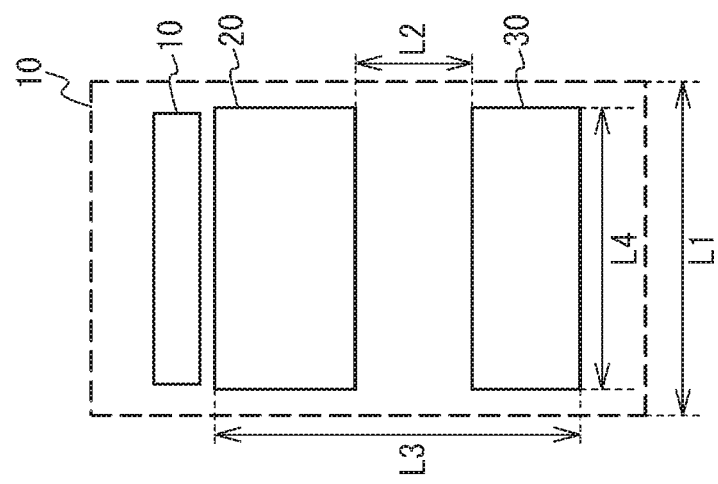

FIG. 5A through FIG. 5C are schematic views for describing the advantage of the first embodiment. FIG. 5A is a plan view of an acoustic wave filter in accordance with the first embodiment, and illustrates the piezoelectric substrate 10, the resonator 40, and the DMSs 20 and 30 in FIG. 3. The length of the shorter side of the piezoelectric substrate 10 is represented by L1, the inner distance between the DMSs 20 and 30 is represented by L2, the outer distance between the DMSs 20 and 30 is represented by L3, and the length of the DMS 30 is represented by L4. In the first embodiment, the IDTs of the DMSs 20 and 30 are arranged in the extension direction of the shorter side. To meet the requirement for the chip size of the piezoelectric substrate 10, the length L1 of the shorter side may be already determined.

To narrow the passband, instead of the method that shifts the passbands of the DMSs 20 and 30 described in the first embodiment, increasing the number of pairs of the DMS 30 is considered. To achieve the passband identical to that of the first embodiment, the number of pairs of the IDTs of the DMS 30 is increased by 50%, and is defined as a DMS 30a. When the ratio between the number of pairs of the IDT and the number of pairs of the reflector is 7:3 in the DMS 30, the length L4a of the DMS 30a is 1.35 times the length L4 of the DMS 30.

As illustrated in FIG. 5B, the length L4a of the DMS 30a becomes greater than the length L1 of the shorter side of the piezoelectric substrate 10. Thus, formation of the DMS 30a on the piezoelectric substrate 10 increases the length of the shorter side.

It may be considered to form the DMS 20 and the DMS 30 rotated by 90° on the piezoelectric substrate 10 as illustrated in FIG. 5C. It is difficult to narrow the inner distance L2 between the DMS 20 and the DMS 30. The reason is as follows. To secure the filter characteristic in FIG. 3, the ground terminal Tgnd for grounding the DMSs 20 and 30 is to be located between the DMSs 20 and 30, and the ground wiring line is thereby not shared by the DMSs 20 and 30. As described above, due to the requirement for the filter characteristic, the inner distance L2 between the DMSs 20 and 30 cannot be reduced. Thus, the outer distance L3 between the DMSs 20 and 30 becomes greater than the length L1 of the shorter side. Accordingly, formation of the DMS 30a on the piezoelectric substrate 10 increases the length of the shorter side.

In the first embodiment, the passband can be narrowed without increasing the number of pairs of the DMS 20 and/or 30. Therefore, the length of the shorter side of the piezoelectric substrate 10 can be reduced.

In the first embodiment, as illustrated in FIG. 1A and FIG. 3, the DMS 20 (a first multimode filter) and the DMS 30 (a second multimode filter) are connected in series between the input terminal Tin and the output terminal Tout. As illustrated in FIG. 4, a part of the passband (a second passband) of the DMS 30 overlaps with the passband (a first passband) of the DMS 20, and the remaining part of the passband of the DMS 30 does not overlap with the passband of the DMS 20. Accordingly, the passband is narrowed and the size is reduced.

The center frequency of the passband of the DMS 20 is represented by f1, and the center frequency of the passband of the DMS 30 is represented by f2. As illustrated in FIG. 2, when Pass/f0 is 2% or less, to narrow the passband, $2\times|f1-f2|/(f1+f2)$ is preferably 0.005 or greater, more preferably 0.001 or greater. To make the passbands of the DMSs 20 and 30 overlap, $2\times|f1-f2|/(f1+f2)$ is preferably 0.02 or less, more preferably 0.015 or less.

The center frequencies of the passbands of the DMSs 20 and 30 are respectively substantially determined by the pitches of the center IDTs 22 and 23. Thus, when the pitch of the electrode fingers of the IDT 22 is represented by PT1 and the pitch of the electrode fingers of the IDT 32 is represented by PT2, $2\times|PT1-PT2|/(PT1+PT2)$ is preferably 0.005 or greater, more preferably 0.01 or greater. $2\times|PT1-PT2|/(PT1+PT2)$ is preferably 0.02 or less, more preferably 0.015 or less.

When each of the IDTs 22 and 32 has a plurality of regions having different pitches, the center frequency of the passband is substantially determined by the pitch of the region having the greatest number of pairs among the regions. Accordingly, PT1 and PT2 are preferably the pitches in the regions where the number of pairs are the greatest among the regions of the IDTs 22 and 32, respectively.

The DMSs 20 and 30 are connected in series through the single node N1. This structure enables to narrow the passband and reduce the size.

The number of IDTs included in each of the first multimode filter and the second multimode filter may be other than three. For example, the number of IDTs may be five. A case where the IDTs 21 and 23 and the IDTs 31 and 33 are connected has been described, but the IDTs 21 and 23 and the IDT 32 may be connected, and the IDTs 31 and 33 may be connected to the output terminal Tout.

As described in the first embodiment, each of the first multimode filter and the second multimode filter has three IDTs. In the DMS 20, the IDT 22 is coupled to the input terminal Tin, and other IDTs 21 and 23 are commonly coupled to the single node N1. In the DMS 30, the IDT 32 is coupled to the output terminal Tout, and other IDTs 31 and 33 are commonly coupled to the single node N1. This structure enables to narrow the passband and reduce the size.

As illustrated in FIG. 3, the one-port resonator 40 having a first end coupled to the input terminal Tin and a second end coupled to the DMS 20 may be provided.

As illustrated in FIG. 3 and FIG. 5A, the arrangement direction of the IDTs of the DMSs 20 and 30 is in the direction in which the shorter side of the piezoelectric substrate 10 extends. Thus, the shorter side of the piezoelectric substrate 10 can be reduced.

As illustrated in FIG. 3, the distance L5*a* between at least one of the reflectors 24 of the DMS 20 and the longer side closest to the at least one of the reflectors 24 of the piezoelectric substrate 10 and the distance L5*b* between at least one of the reflectors 34 of the DMS 30 and the longer side closest to the at least one of the reflectors 34 of the piezoelectric substrate 10 are less than the width L6 of the connection electrode 15 (a bump or a via wiring). The first embodiment can narrow the passband without increasing the number of pairs of the DMS 20 and/or 30. Thus, even when the length L1 of the shorter side of the piezoelectric substrate 10 is small, the arrangement direction of the IDTs of the DMSs 20 and 30 can be made to be in the direction in which the shorter side of the piezoelectric substrate 10 extends by making the distances L5*a* and L5*b* less than the width L6 of the connection electrode 15.

Even when the distance L3 between the outer edge of the DMS 20 and the outer edge of the DMS 30 is less than the length L1 of the shorter side of the piezoelectric substrate 10, the DMSs 20 and 30 can be arranged on the piezoelectric substrate 10 by making the arrangement direction of the IDTs of the DMSs 20 and 30 be in the direction in which the shorter side of the piezoelectric substrate 10 extends as illustrated in FIG. 5A.

First Variation of the First Embodiment

Figure 6:
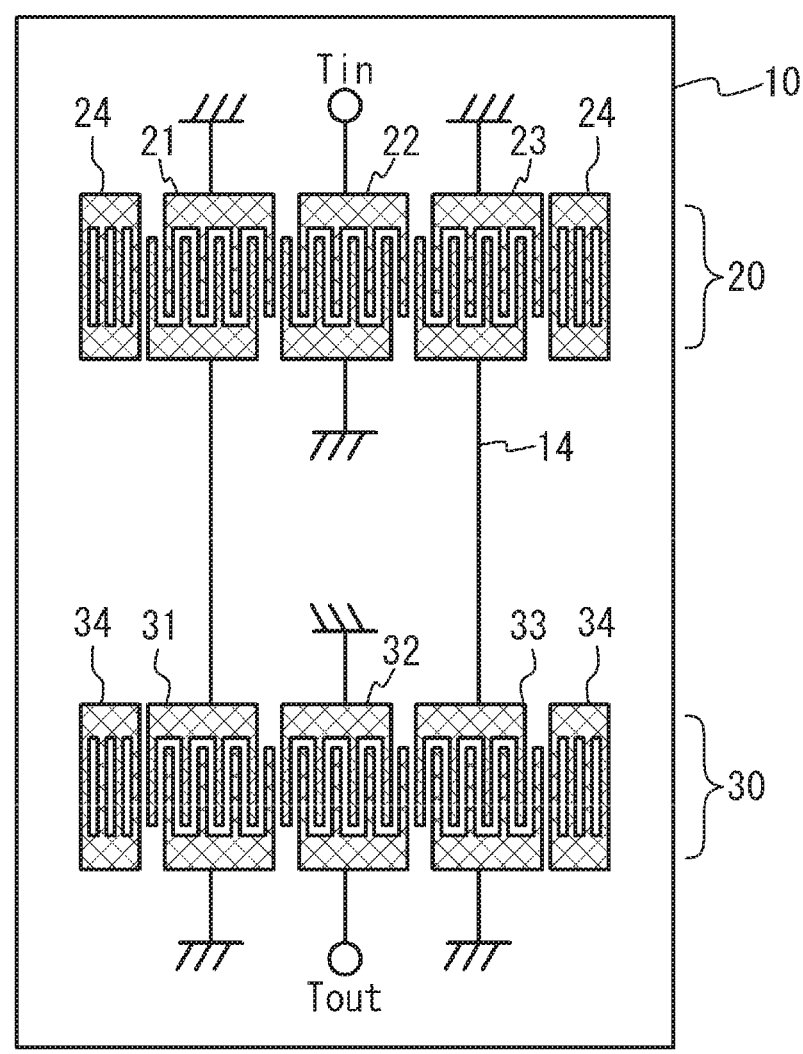
FIG. 6 is a plan view of an acoustic wave filter in accordance with a first variation of the first embodiment.

FIG. 6 is a plan view of an acoustic wave filter in accordance with a first variation of the first embodiment. As illustrated in FIG. 6, the DMSs 20 and 30 may be cascade-connected (cascade connection). That is, the IDTs 21 and 31 are connected through the wiring line 14, the IDTs 23 and 33 are connected through the wiring line 14, and the IDTs 21 and 31 and the IDTs 23 and 33 are not connected. Also in the structure where each of the first multimode filter and the second multimode filter has four or more IDTs, they may be cascade-connected. As described above, the cascade connection is included in a series connection in a broad sense.

The acoustic wave filter according to any one of the first embodiment and the variation thereof may be used for multiplexers such as duplexers.

Although the embodiments of the present invention have been described in detail, it is to be understood that the various change, substitutions, and alterations could be made hereto without departing from the spirit and scope of the invention.

What is claimed is:

1. An acoustic wave filter comprising:
a piezoelectric substrate;
a first multimode filter that includes at least three first IDTs located on the piezoelectric substrate, has a first passband, and is connected between an input terminal and an output terminal; and
a second multimode filter that includes at least three second IDTs located on the piezoelectric substrate, has a second passband, and is connected in series with the first multimode filter between the input terminal and the output terminal, a part of the second passband overlapping with the first passband, a remaining part of the second passband not overlapping with the first passband,
wherein:
$0.01 \leq 2 \times |f1-f2|/(f1+f2) < 0.02$
where f1 represents a center frequency of the first passband and f2 represents a center frequency of the second passband,
each of a center first IDT of the at least three first IDTs and adjacent first IDTs to the center first IDT includes a pair of first comb-shaped electrodes, electrode fingers of one of the pair of first comb-shaped electrodes and electrode fingers of another of the pair of first comb-shaped electrodes are alternately arranged, and no electrode is located between the center first IDT and the adjacent first IDTs, and
each of a center second IDT of the at least three second IDTs and adjacent second IDTs to the center second IDT includes a pair of second comb-shaped electrodes, electrode fingers of one of the pair of second comb-shaped electrodes and electrode fingers of another of the pair of second comb-shaped electrodes are alternately arranged, and no electrode is located between the center second IDT and the adjacent second IDTs.

2. The acoustic wave filter according to claim 1, wherein the first multimode filter and the second multimode filter are connected in series through a single node.

3. The acoustic wave filter according to claim 1, wherein the at least three first IDTs of the first multimode filter are three first IDTs, and a center first IDT of the three first IDTs is coupled to the input terminal and remaining first IDTs are coupled to a single node, and
the at least three second IDTs of the second multimode filter are three second IDTs, and a center second IDT of the three second IDTs is coupled to the output terminal and remaining second IDTs are coupled to the single node.

4. The acoustic wave filter according to claim 3, further comprising:
a one-port resonator having a first end coupled to the input terminal and a second end coupled to the center first IDT of the first multimode filter.

5. The acoustic wave filter according to claim 1, wherein the piezoelectric substrate is rectangular, and
an arrangement direction of the at least three first IDTs of the first multimode filter and an arrangement direction of the at least three second IDTs of the second multimode filter are in a direction in which a shorter side of the piezoelectric substrate extends.

6. The acoustic wave filter according to claim 5, further comprising:
an input connection electrode that is located on the piezoelectric substrate and is a bump or a via wiring electrically connecting to the input terminal; and
an output connection electrode that is located on the piezoelectric substrate and is a bump or a via wiring electrically connecting to the output terminal, wherein
the first multimode filter includes first reflectors located at both sides of the at least three first IDTs,
the second multimode filter includes second reflectors located at both sides of the at least three second IDTs, and
a distance between at least one of the first reflectors of the first multimode filter and a longer side closest to the at least one of the first reflectors of the first multimode filter of the piezoelectric substrate and a distance between at least one of the second reflectors of the second multimode filter and a longer side closest to the at least one of the second reflectors of the second multimode filter of the piezoelectric substrate are less than a width of the input connection electrode and a width of the output connection electrode.

7. The acoustic wave filter according to claim 1, wherein:
a skirt characteristic at a low frequency side of the first passband is steeper than a skirt characteristic at a high frequency side of the first passband, and
a skirt characteristic at a high frequency side of the second passband is steeper than a skirt characteristic at a low frequency side of the second passband.

8. An acoustic wave filter comprising:
a piezoelectric substrate;
a first multimode filter that includes at least three first IDTs located on the piezoelectric substrate and is connected between an input terminal and an output terminal, a pitch of a center first IDT of the at least three first IDTs being PT1; and
a second multimode filter that includes at least three second IDTs located on the piezoelectric substrate and is connected in series with the first multimode filter between the input terminal and the output terminal, a pitch of a center second IDT of the at least three second IDTs being PT2, $0.01 \leq 2 \times |PT1-PT2|/(PT1+PT2) \leq 0.02$,
wherein:
each of the center first IDT of the at least three first IDTs and adjacent first IDTs to the center first IDT includes a pair of first comb-shaped electrodes, electrode fingers of one of the pair of first comb-shaped electrodes and electrode fingers of another of the pair of first comb-shaped electrodes are alternately arranged, and no electrode is located between the center first IDT and the adjacent first IDTs, and
each of the center second IDT of the at least three second IDTs and adjacent second IDTs to the center second IDT includes a pair of second comb-shaped electrodes, electrode fingers of one of the pair of second comb-shaped electrodes and electrode fingers of another of the pair of second comb-shaped electrodes are alternately arranged, and no electrode is located between the center second IDT and the adjacent second IDTs.

9. The acoustic wave filter according to claim 8, wherein the center first IDT of the first multimode filter has a plurality of first regions having different pitches, and a pitch of a first region having a greatest number of pairs among the plurality of first regions is PT1, and
the center second IDT of the second multimode filter has a plurality of second regions having different pitches, and a pitch of a second region having a greatest number of pairs among the plurality of second regions is PT2.

10. The acoustic wave filter according to claim 8, wherein the first multimode filter and the second multimode filter are connected in series through a single node.

11. The acoustic wave filter according to claim 8, wherein the at least three first IDTs of the first multimode filter are three first IDTs, and the center first IDT of the three first IDTs is coupled to the input terminal and remaining first IDTs are coupled to a single node, and
the at least three second IDTs of the second multimode filter are three second IDTs, and the center second IDT of the three second IDTs is coupled to the output terminal and remaining second IDTs are coupled to the single node.

12. The acoustic wave filter according to claim 11, further comprising:

a one-port resonator having a first end coupled to the input terminal and a second end coupled to the center first IDT of the first multimode filter.

13. The acoustic wave filter according to claim 8, wherein the piezoelectric substrate is rectangular, and
an arrangement direction of the at least three first IDTs of the first multimode filter and an arrangement direction of the at least three second IDTs of the second multimode filter are in a direction in which a shorter side of the piezoelectric substrate extends.

14. The acoustic wave filter according to claim 13, further comprising:
an input connection electrode that is located on the piezoelectric substrate and is a bump or a via wiring electrically connecting to the input terminal; and
an output connection electrode that is located on the piezoelectric substrate and is a bump or a via wiring electrically connecting to the output terminal, wherein
the first multimode filter includes first reflectors located at both sides of the at least three first IDTs,
the second multimode filter includes second reflectors located at both sides of the at least three second IDTs, and
a distance between at least one of the first reflectors of the first multimode filter and a longer side closest to the at least one of the first reflectors of the first multimode filter of the piezoelectric substrate and a distance between at least one of the second reflectors of the second multimode filter and a longer side closest to the at least one of the second reflectors of the second multimode filter of the piezoelectric substrate are less than a width of the input connection electrode and a width of the output connection electrode.

15. The acoustic wave filter according to claim 8, wherein:
a skirt characteristic at a high frequency side of the first passband is steeper than a skirt characteristic at a low frequency side of the first passband, and
a skirt characteristic at a low frequency side of the second passband is steeper than a skirt characteristic at a high frequency side of the second passband.

16. An acoustic wave filter comprising:
a piezoelectric substrate;
a first multimode filter that includes at least three first IDTs located on the piezoelectric substrate, has a first passband, and is connected between an input terminal and an output terminal; and
a second multimode filter that includes at least three second IDTs located on the piezoelectric substrate, has a second passband, and is connected in series with the first multimode filter between the input terminal and the output terminal, a part of the second passband overlapping with the first passband, a remaining part of the second passband not overlapping with the first passband,
wherein:
the piezoelectric substrate is rectangular,
an arrangement direction of the at least three first IDTs of the first multimode filter and an arrangement direction of the at least three second IDTs of the second multimode filter are in a direction in which a shorter side of the piezoelectric substrate extends, and
a distance between an outer edge of the at least three first IDTs of the first multimode filter and an outer edge of the at least three second IDTs of the second multimode filter in a longer side direction in which a longer side of the piezoelectric substrate extends is greater than a length of a shorter side of the piezoelectric substrate.

17. An acoustic wave filter comprising:

a piezoelectric substrate;

a first multimode filter that includes at least three first IDTs located on the piezoelectric substrate and is connected between an input terminal and an output terminal, a pitch of a center first IDT of the at least three first IDTs being PT1; and a second multimode filter that includes at least three second IDTs located on the piezoelectric substrate and is connected in series with the first multimode filter between the input terminal and the output terminal, a pitch of a center second IDT of the at least three second IDTs being PT2, $0.005 \leq 2 \times |PT1-PT2|/(PT1+PT2) \leq 0.02$, wherein:

the piezoelectric substrate is rectangular, an arrangement direction of the at least three first IDTs of the first multimode filter and an arrangement direction of the at least three second IDTs of the second multimode filter are in a direction in which a shorter side of the piezoelectric substrate extends, and a distance between an outer edge of the at least three first IDTs of the first multimode filter and an outer edge of the at least three second IDTs of the second multimode filter in a longer side direction in which a longer side of the piezoelectric substrate extends is greater than a length of a shorter side of the piezoelectric substrate.

* * * * *